United States Patent
Makino et al.

(10) Patent No.: US 11,169,224 B2
(45) Date of Patent: *Nov. 9, 2021

(54) MAGNETIC FIELD DETECTION DEVICE AND METHOD OF DETECTING MAGNETIC FIELD

(71) Applicant: TDK CORPORATION, Tokyo (JP)

(72) Inventors: Kenzo Makino, Tokyo (JP); Hiraku Hirabayashi, Tokyo (JP)

(73) Assignee: TDK CORPORATION, Tokyo (JP)

(*) Notice: Subject to any disclaimer, the term of this patent is extended or adjusted under 35 U.S.C. 154(b) by 49 days.

This patent is subject to a terminal disclaimer.

(21) Appl. No.: 16/700,100

(22) Filed: Dec. 2, 2019

(65) Prior Publication Data

US 2020/0209325 A1 Jul. 2, 2020

(30) Foreign Application Priority Data

Dec. 27, 2018 (JP) .............................. JP2018-245330

(51) Int. Cl.
*G01R 33/09* (2006.01)
*H03M 1/12* (2006.01)

(52) U.S. Cl.
CPC ............. *G01R 33/09* (2013.01); *H03M 1/124* (2013.01)

(58) Field of Classification Search
CPC ...... G01R 33/09; G01R 33/093; G01R 15/20; G01R 33/098; G01R 33/0041
See application file for complete search history.

(56) References Cited

U.S. PATENT DOCUMENTS

| | | | |
|---|---|---|---|
| 5,627,318 A * | 5/1997 | Fujii | B81B 7/0006 361/283.3 |
| 7,915,891 B2 | 3/2011 | Edelstein | |
| 10,175,307 B1 * | 1/2019 | Sorenson | G01R 33/0286 |
| 10,495,702 B2 | 12/2019 | Higashi et al. | |
| 2015/0168503 A1 * | 6/2015 | Kim | G01R 33/0286 324/244 |
| 2018/0279990 A1 | 10/2018 | Hasegawa et al. | |
| 2020/0200838 A1 * | 6/2020 | Kiyono | G01R 33/0094 |
| 2020/0300944 A1 * | 9/2020 | Makino | G01R 33/09 |

FOREIGN PATENT DOCUMENTS

JP    H11-101861 A    4/1999

* cited by examiner

*Primary Examiner* — Alesa Allgood
(74) *Attorney, Agent, or Firm* — Oliff PLC

(57) ABSTRACT

A magnetic field detection device includes a magnetic field detection element, a modulator, and a demodulator. The magnetic field detection element has a sensitivity axis in a first direction. The modulator is configured to apply, to the magnetic field detection element, a stress oscillating at a first frequency and including a component in a second direction, the second direction being orthogonal to the first direction. The demodulator is configured to demodulate an output signal having the first frequency and outputted from the magnetic field detection element, and detect, on a basis of an amplitude of the output signal, an intensity of a measurement magnetic field to be received by the magnetic field detection element.

13 Claims, 13 Drawing Sheets

MAGNETIC FIELD DETECTION DEVICE AND METHOD OF DETECTING MAGNETIC FIELD

CROSS REFERENCE TO RELATED APPLICATIONS

This application claims the benefit of Japanese Priority Patent Application No. 2018-245330 filed on Dec. 27, 2018, the entire contents of which are incorporated herein by reference.

BACKGROUND

The disclosure relates to a magnetic field detection device including a magnetic field detection element, and a method of detecting a magnetic field using the magnetic field detection element.

Up to now, there has been proposed a magneto-resistive effect sensor that exhibits a high detection resolution with respect to an external magnetic field by applying an alternating current magnetic field to a giant magneto-resistive effect element. Reference is made to Japanese Unexamined Patent Application Publication No. H11-101861, for example. In addition, there has been proposed a microelectromechanical system (MEMS) device having a structure in which a magnetic flux is concentrated at a magnetic field sensor. Reference is made to U.S. Pat. No. 7,915,891, for example.

SUMMARY

A magnetic field detection device according to one example embodiment of the disclosure includes: a magnetic field detection element having a sensitivity axis in a first direction; a modulator configured to apply, to the magnetic field detection element, a stress oscillating at a first frequency and including a component in a second direction, the second direction being orthogonal to the first direction; and a demodulator configured to demodulate an output signal having the first frequency and outputted from the magnetic field detection element, and detect, on a basis of an amplitude of the output signal, an intensity of a measurement magnetic field to be received by the magnetic field detection element.

A method of detecting a magnetic field according to one example embodiment of the disclosure includes: applying, to a magnetic field detection element having a sensitivity axis in a first direction, a stress oscillating at a first frequency and including a component in a second direction, the second direction being orthogonal to the first direction; and detecting, on a basis of an amplitude of an output signal having the first frequency and outputted from the magnetic field detection element, an intensity of a measurement magnetic field to be received by the magnetic field detection element.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1A:
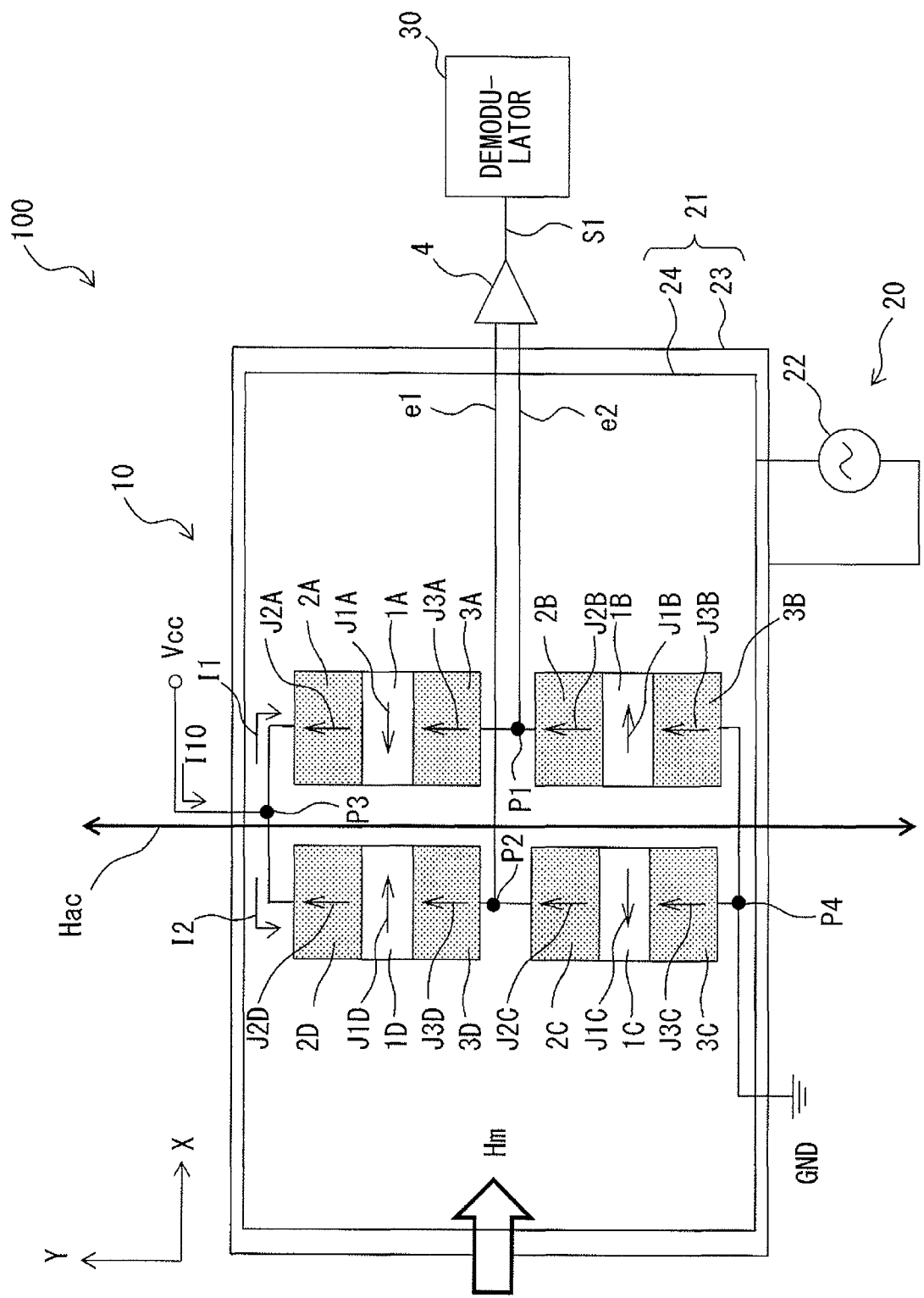
FIG. 1A is a schematic diagram illustrating an overall configuration example of a magnetic field detection device according to one example embodiment of the disclosure.

Some embodiments of the disclosure are described below in detail with reference to the accompanying drawings. It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. The description is given in the following order.
1. First Example Embodiment (Example of a magnetic field detection device provided with a demodulator including a high-pass filter and a phase detection circuit)
2. Second Example Embodiment (Example of a magnetic field detection device provided with a demodulator including a high-pass filter and a sample-and-hold circuit)
3. Modification Examples It is desirable that a magnetic field detection device have a higher detection resolution with respect to a magnetic field.

It is desirable to provide a magnetic field detection device having a higher detection resolution, and a method of detecting a magnetic field that makes it possible to detect the magnetic field with a higher detection resolution.

1. FIRST EXAMPLE EMBODIMENT

Configuration of Magnetic Field Detection Device 100

Figure 1B:
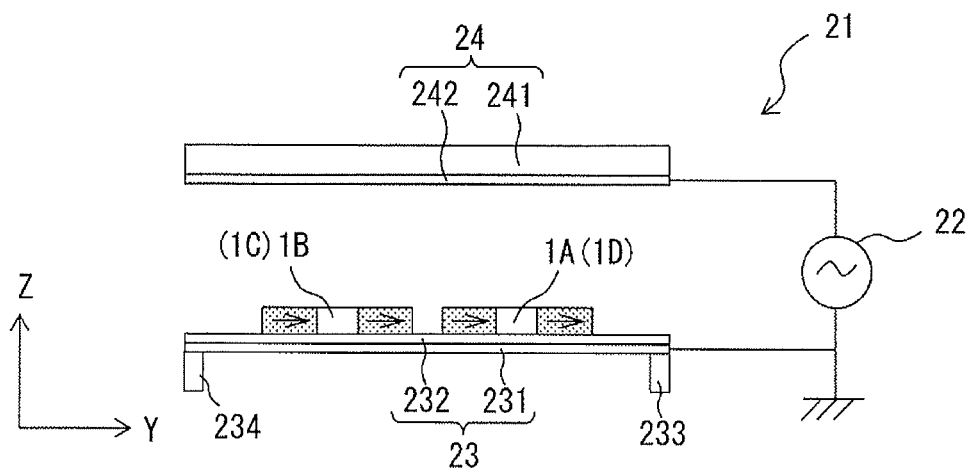
FIG. 1B is a schematic view of a configuration example of a modulator included in the magnetic field detection device illustrated in FIG. 1A.

FIG. 1A is a schematic diagram illustrating an overall configuration example of a magnetic field detection device 100 according to a first example embodiment of the disclosure. The magnetic field detection device 100 includes a modulator 20 and a demodulator 30. In some example embodiments, the magnetic field detection device 100 may include a magnetic field detection section 10 and the modulator 20 including a stress application section 21. FIG. 1B is an explanatory diagram illustrating a configuration example of the modulator 20.

Magnetic Field Detection Section 10

The magnetic field detection section 10 may include, for example, four magnetic field detection elements 1A to 1D, and the magnetic field detection elements 1A to 1D may be bridged to form a bridge circuit. The magnetic field detection elements 1A to 1D are each provided on a stress application section 21, for example, and each have a sensitivity axis in an X-axis direction. To the magnetic field detection elements 1A to 1D, magneto-resistive effect (MR) elements may be applicable, for example. In a case where the magnetic field detection elements 1A to 1D are the MR elements, a magnetization direction of a pinned layer of each MR element may be substantially parallel to the sensitivity axis. In one example, the magnetic field detection element 1A may include a pinned layer having a magnetization J1A in a −X direction, the magnetic field detection element 1B may include a pinned layer having a magnetization J1B in a +X direction, the magnetic field detection element 1C may include a pinned layer having a magnetization J1C in the −X direction, and the magnetic field detection element 1D may include a pinned layer having a magnetization J1D in the +X direction.

The magnetic field detection section 10 may further include permanent magnets 2A to 2D and permanent magnets 3A to 3D. The permanent magnet 2A and the permanent magnet 3A may be opposed to each other with the magnetic field detection element 1A interposed therebetween, and may respectively have a magnetization J2A in a +Y direction and a magnetization J3A in the +Y direction. The +Y direction may be orthogonal to the direction of the magnetization J1A, for example. The permanent magnet 2B and the permanent magnet 3B may be opposed to each other with the magnetic field detection element 1B interposed therebetween, and may respectively have a magnetization J2B in the +Y direction and a magnetization J3B in the +Y direction. The +Y direction may be orthogonal to the direction of the magnetization J1B, for example. The permanent magnet 2C and the permanent magnet 3C may be opposed to each other with the magnetic field detection element 1C interposed therebetween, and may respectively have a magnetization J2C in the +Y direction and a magnetization J3C in the +Y direction. The +Y direction may be orthogonal to the direction of the magnetization J1C, for example. The permanent magnet 2D and the permanent magnet 3D may be opposed to each other with the magnetic field detection element 1D interposed therebetween, and may respectively have a magnetization J2D in the +Y direction and a magnetization J3D in the +Y direction. The +Y direction may be orthogonal to the direction of the magnetization J1D, for example. With such a configuration, the permanent magnets 2A to 2D and the permanent magnets 3A to 3D may each apply a bias magnetic field in the +Y direction to the corresponding one of the magnetic field detection elements 1A to 1D. In one embodiment of the disclosure, the permanent magnets 2A to 2D and the permanent magnets 3A to 3D each correspond to a specific but non-limiting example of a "bias magnetic field-applying section".

In the bridge circuit of the magnetic field detection section 10, a first end of the magnetic field detection element 1A and a first end of the magnetic field detection element 1B may be coupled at a node P1, and a first end of the magnetic field detection element 1C and a first end of the magnetic field detection element 1D may be coupled at a node P2. Further, a second end of the magnetic field detection element 1A and a second end of the magnetic field detection element 1D may be coupled at a node P3, and a second end of the magnetic field detection element 1B and a second end of the magnetic field detection element 1C may be coupled at a node P4. Here, the node P3 may be coupled to a power supply Vcc, and the node P4 may be coupled to a ground. Each of the nodes P1 and P2 may be coupled to an input terminal of a differential detector 4. The differential detector 4 may detect a potential difference between the node P1 and the node P2 at a time when a voltage is applied between the node P3 and the node P4, and may output the detected potential difference to a demodulator 30 as a differential signal S1.

Modulator 20

The modulator 20 may include a stress application section 21 and an alternating current (AC) power supply 22. Upon an AC voltage being applied by the AC power supply 22, the stress application section 21 is configured to apply, to the magnetic field detection elements 1A to 1D, a stress oscillating at a first frequency and including a component in a Y-axis direction. The Y-axis direction is orthogonal to the X-axis direction. The stress applied to each of the magnetic field detection elements 1A to 1D may cause a sensitivity modulation in the magnetic field detection elements 1A to 1D. As illustrated in FIG. 1B, the stress application section 21 may include a deformation section 23 and a fixing section 24. The deformation section 23 may include a first substrate 231 and a first electrode 232. The first substrate 231 may exhibit an elasticity and may have an insulating property. The first electrode 232 may be provided on the first substrate 231. The first substrate 231 may be supported by a support 233 and a support 234 at respective ends in the Y-axis direction. Relative positions of the supports 233 and 234 to the fixing section 24 may be fixed. The fixing section 24 may include a second substrate 241 and a second electrode 242. The second substrate 241 may exhibit a rigidity higher than a rigidity of the first base and may have an insulating property. The second electrode 242 may be provided on the second substrate 241, and may be separated away from and may face the first electrode 232. The magnetic field detection elements 1A to 1D may be provided on the deformation section 23 and may be electrically insulated from the first electrode 232. It is to be noted that, although the magnetic field detection elements 1A to 1D are provided on a surface, of the deformation section 23, which faces the fixing section 24 in an example illustrated in FIG. 1B, the magnetic field detection elements 1A to 1D may also be provided on a surface, of the deformation section 23, opposite to the fixing section 24. In the modulator 20, an electrostatic force may be configured to be generated between the deformation section 23 and the fixing section 24 by an alternating current voltage being applied by the AC power supply 22 to the first electrode 232 and the second electrode 242. In one embodiment of the disclosure, the X-axis direction corresponds to a specific but non-limiting example of a "first direction". In one embodiment of the disclosure, the Y-axis direction corresponds to a specific but non-limiting example of a "second direction". In one embodiment of the disclosure, the first substrate 231 corresponds to a specific but non-limiting example of a "first base". In one embodiment of the disclosure, the second substrate 241 corresponds to a specific but non-limiting example of a "second base".

The first substrate 231 may include alumina ($Al_2O_3$) and may have a thickness of approximately 2 μm, for example. The second substrate 241 may include silicon (Si) and may have a thickness of approximately 3 μm, for example. Further, the first electrode 232 and the second electrode 242 may each be a thin film including copper, for example. The first electrode 232 and the second electrode 242 may be respectively provided on a surface of the first substrate 231 and a surface of the second substrate 241, or may be respectively provided inside the first substrate 231 and inside second substrate 241.

Figure 1C:
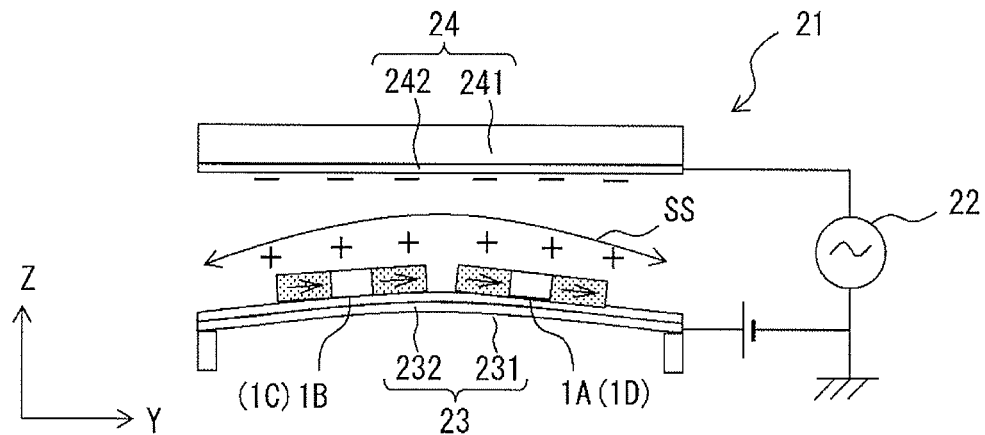
FIG. 1C is a first explanatory diagram illustrating an operation of the modulator illustrated in FIG. 1B.
Figure 1D:
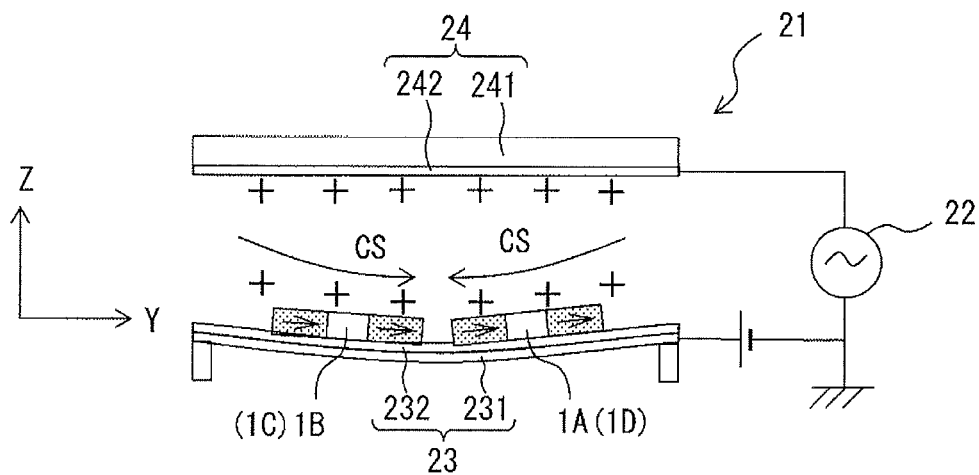
FIG. 1D is a second explanatory diagram illustrating an operation of the modulator illustrated in FIG. 1C.

Next, description is given, with reference to FIG. 1C and FIG. 1D, of operations of the stress application section 21 included in the modulator 20.

FIG. 1C illustrates a state in which the deformation section 23 is deformed such that the deformation section 23 is protruded in a Z-axis direction toward the fixing section 24. In a case where the deformation section 23 is deformed as illustrated in FIG. 1C, the AC power supply 22 may apply the AC voltage to the stress application section 21 to cause a sign of an electric potential of the first electrode 232 to be opposite to a sign of an electric potential of the second electrode 242. In that case, as illustrated in FIG. 1C, a direct current (DC) power supply may be coupled between the deformation section 23 and the AC power supply 22. FIG. 1C illustrates an example of a case where the first electrode 232 of the deformation section 23 has a positive electric potential and the second electrode 242 of the fixing section 24 has a negative electric potential. However, there may be a case where the first electrode 232 has the negative electric potential and the second electrode 242 has the positive electric potential. In those cases, the first electrode 232 and the second electrode 242 may attract each other, hence, the deformation section 23 including the first substrate 231 having a high elasticity may be deformed such that the deformation section 23 is protruded toward the fixing section 24. The both ends in the Y-axis direction of the first substrate 231 may be fixed by the respective supports 233 and 234, therefore, the deformation section 23 may be bent most at a center position between the support 233 and the support 234 in the Y-axis direction (in a direction in which the support 233 and the support 234 are disposed). When the deformation section 23 is deformed as in FIG. 1C, a stretching stress SS in the Y-axis direction may be applied to the magnetic field detection elements 1A to 1D provided on the deformation section 23. Here, in a case where a magnetostrictive constant of a free layer included in each of the magnetic field detection elements 1A to 1D is positive, each free layer may exhibit an elasticity magnetic anisotropy in a direction that increases the bias magnetic field in the Y-axis direction. That is, the sensitivity of the magnetic field detection elements 1A to 1D may decrease. In an opposite way, in a case where the magnetostrictive constant of the free layer included in each of the magnetic field detection elements 1A to 1D is negative, each free layer may exhibit the elasticity magnetic anisotropy in a direction that decreases the bias magnetic field in the Y-axis direction. That is, the sensitivity of the magnetic field detection elements 1A to 1D may increase.

By contrast, FIG. 1D illustrates a state in which the deformation section 23 is deformed such that the deformation section 23 is protruded toward the opposite side of the fixing section 24. In FIG. 1D, the AC power supply 22 may apply the AC voltage to the stress application section 21 to cause the sign of the electric potential of the first electrode 232 to be the same as the sign of the electric potential of the second electrode 242. In that case, as illustrated in FIG. 1D, the DC power supply may be coupled between the deformation section 23 and the AC power supply 22. FIG. 1D illustrates an example of a case where the first electrode 232 of the deformation section 23 has the positive electric potential and the second electrode 242 of the fixing section 24 also has the positive electric potential. However, there may be a case where the first electrode 232 has the negative electric potential and the second electrode 242 also has the negative electric potential. In those cases, the first electrode 232 and the second electrode 242 may repel each other, hence, the deformation section 23 including the first substrate 231 having a high elasticity may be deformed such that the deformation section 23 is protruded toward the opposite side to the fixing section 24. Here, the both ends of the deformation section 23 may be fixed by the respective supports 233 and 234. Therefore, a position at the center between the support 233 and the support 234 in the Y-axis direction (a direction in which the support 233 and the support 234 are disposed) may be bent most. When the deformation section 23 is deformed as in FIG. 1D, a compressive stress CS in the Y-axis direction may be applied to the magnetic field detection elements 1A to 1D provided on the deformation section 23. Here, in a case where the magnetostrictive constant of the free layer included in each of the magnetic field detection elements 1A to 1D is positive, each free layer may exhibit an elasticity magnetic anisotropy in a direction that decreases the bias magnetic field in the Y-axis direction. That is, the sensitivity of the magnetic field detection elements 1A to 1D may increase. In an opposite way, in a case where the magnetostrictive constant of the free layer included in each of the magnetic field detection elements 1A to 1D is negative, each free layer may exhibit the elasticity magnetic anisotropy in a direction that increases the bias magnetic field in the Y-axis direction. That is, the sensitivity of the magnetic field detection elements 1A to 1D may decrease.

Demodulator 30

Figure 2:
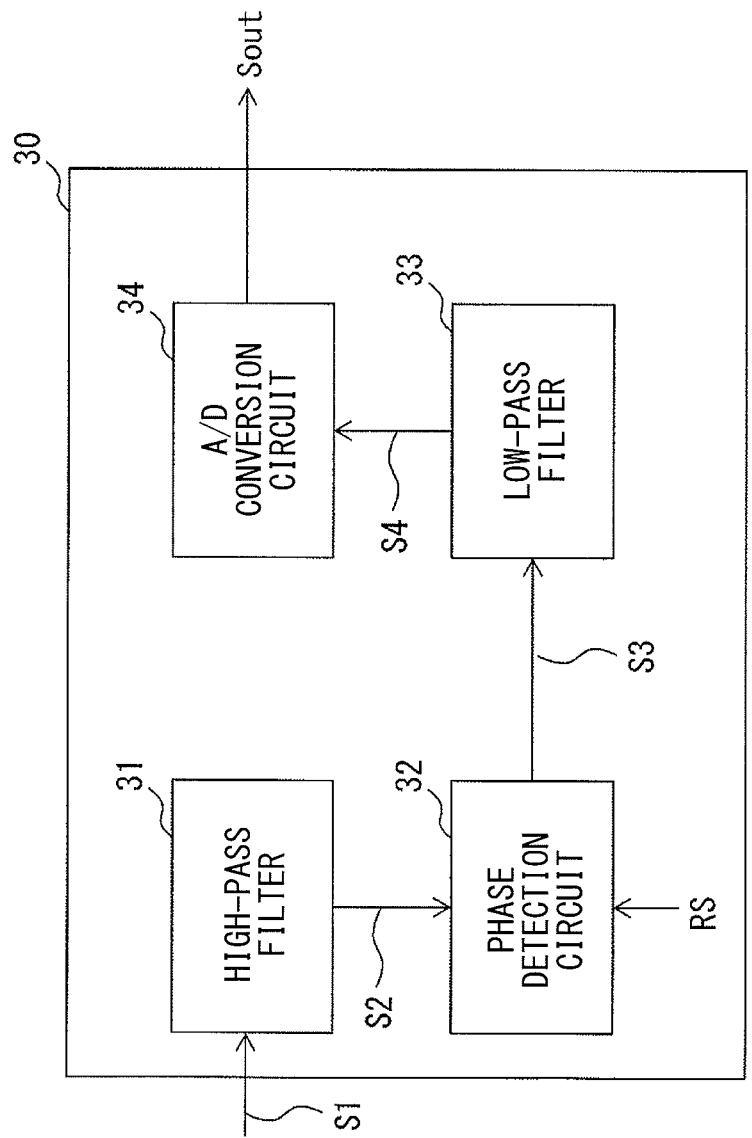
FIG. 2 is a block diagram illustrating a configuration example of a demodulator included in the magnetic field detection device illustrated in FIG. 1A.

The demodulator 30 demodulates an output signal, i.e., differential signal S1, having the first frequency outputted from the magnetic field detection elements 1A to 1D, and detects, on the basis of an amplitude of the differential signal S1, an intensity of a measurement magnetic field Hm serving as a detection target magnetic field to be received by the magnetic field detection elements 1A to 1D. With reference to FIG. 2, a configuration of the demodulator 30 is specifically described. FIG. 2 is a block diagram illustrating a configuration example of the demodulator 30.

As illustrated in FIG. 2, the demodulator 30 may include, from an upstream to a downstream, a high-pass filter 31, a phase detection circuit 32, a low-pass filter 33, and an analog/digital (A/D) conversion circuit 34.

The high-pass filter 31 may pass a frequency component that is at a frequency higher than or equal to a second frequency, and outputs an output signal S2 to the phase detection circuit 32. The second frequency is lower than the first frequency. For example, in a case where the first frequency is 1 (one) kHz, the second frequency may be 500 Hz.

The phase detection circuit 32 may refer to a reference signal RS, and may output a phase detection signal S3 from the output signal S2 outputted from the high-pass filter 31. The reference signal RS may be a square wave having the first frequency and a phase that is the same as a phase of the differential signal S1 having the first frequency (for example, 1 (one) kHz) outputted from the magnetic field detection elements 1A to 1D. The phase detection signal S3 may be guided to the low-pass filter 33.

The low-pass filter 33 may smooth a measurement component of the phase detection signal S3, and outputs an output signal S4 to the A/D conversion circuit 34. In one embodiment of the disclosure, the output signal S4 corresponds to a specific but non-limiting example of a "measurement component".

The A/D conversion circuit 34 may perform an A/D conversion on an output signal S4 serving as the measurement component which has passed the low-pass filter 33 and has been smoothed, and output an output signal Sout to an outside. In one embodiment of the disclosure, the A/D conversion circuit 34 corresponds to a specific but non-limiting example of an "analog-to-digital converter".

Operations and Workings of Magnetic Field Detection Device 100

The magnetic field detection device 100 according to the first embodiment is able to detect an intensity of the measurement magnetic field Hm serving as the detection target magnetic field to be received by the magnetic field detection elements 1A to 1D. For example, the magnetic field detection device 100 is enhanced in the resolution of the magnetic field detection elements 1A to 1D owing to the modulator 20, thereby enabling detection with high accuracy even when the measurement magnetic field Hm is weaker.

Figure 3:
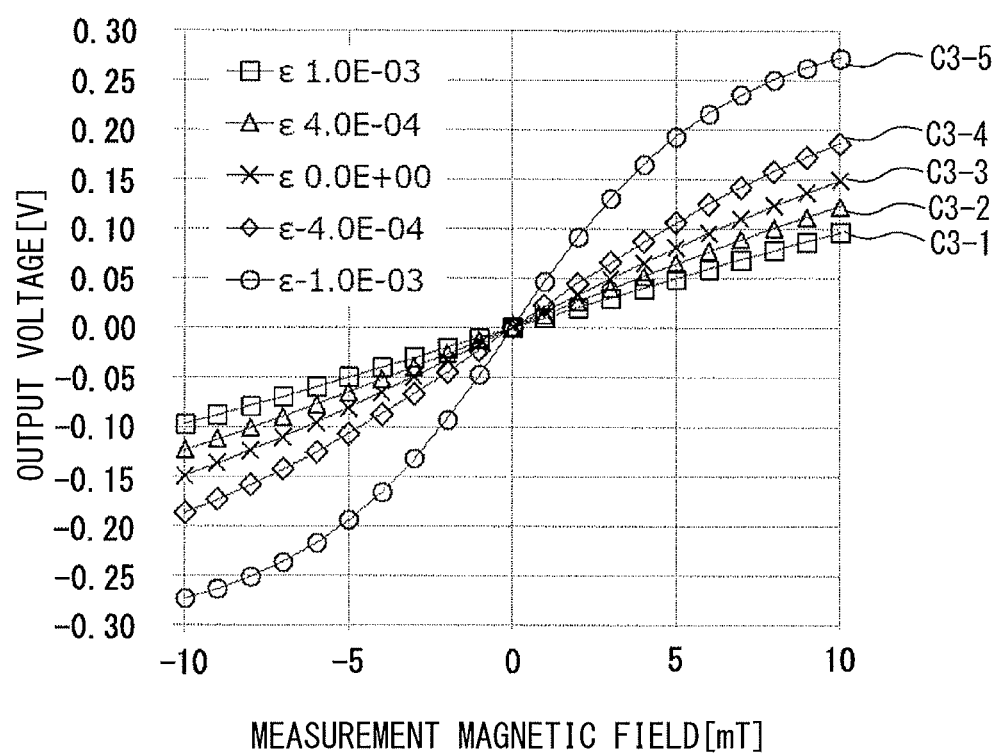
FIG. 3 is a characteristic diagram describing a sensitivity modulation of magnetic field detection elements.

FIG. 3 is a characteristic diagram describing a sensitivity modulation of the magnetic field detection elements 1A to 1D performed by the modulator 20. FIG. 3 illustrates an output voltage [V] of the differential signal S1. The differential signal S1 is obtained by, while applying a stress in the Y-axis direction to the magnetic field detection elements 1A to 1D, applying the measurement magnetic field Hm in a range from −10 mT to +10 mT in the X-axis direction. It is to be noted that the magnetostrictive constant of the free layer in each of the magnetic field detection elements 1A to 1D is positive. In FIG. 3, the horizontal axis indicates the measurement magnetic field Hm [mT], and the vertical axis indicates the output voltage [V]. FIG. 3 illustrates a relationship between the measurement magnetic field Hm and the output voltage [V] in a case where each of five levels of strains $\varepsilon$, +1.0E-03, +4.0E-04, 0.0E+00, −4.0E-04, and −1.0E-03, is caused to occur in the Y-axis direction by applying the stress to the magnetic field detection elements 1A to 1D. In FIG. 3, a curve C3-1 represents a characteristic in a case where a strain $\varepsilon$ of +1.0E-03 is caused to occur in the magnetic field detection elements 1A to 1D, a curve C3-2 represents a characteristic in a case where a strain $\varepsilon$ of +4.0E-04 is caused to occur in the magnetic field detection elements 1A to 1D, a curve C3-3 represents a characteristic in a case where a strain $\varepsilon$ of 0.0E+00 is caused to occur in the magnetic field detection elements 1A to 1D, a curve C3-4 represents a characteristic in a case where a strain $\varepsilon$ of −4.0E-04 is caused to occur in the magnetic field detection elements 1A to 1D, and a curve C3-5 represents a characteristic in a case where a strain $\varepsilon$ of −1.0E-03 is caused to occur in the magnetic field detection elements 1A to 1D. It is to be noted that a strain $\varepsilon$ having a positive value means that the stretching stress SS in the Y-axis direction, which is parallel to the direction of the bias magnetic field applied by each of the permanent magnets 2A to 2D and the permanent magnets 3A to 3D, is applied to the magnetic field detection elements 1A to 1D. In this case, the bias magnetic field applied by the permanent magnets 2A to 2D and the permanent magnets 3A to 3D may be increased, and the sensitivity of the magnetic field detection elements 1A to 1D may decrease. By contrast, a strain $\varepsilon$ having a negative value means that the compressive stress CS in the Y-axis direction is applied to the magnetic field detection elements 1A to 1D. In this case, the bias magnetic field applied by the permanent magnets 2A to 2D and the permanent magnets 3A to 3D may be decreased, and the sensitivity of the magnetic field detection elements 1A to 1D may increase. The strain $\varepsilon$ as used herein refers to a ratio of an amount of change of a size in the Y-axis direction of the magnetic field detection elements 1A to 1D after the stress in the Y-axis direction is applied to a size in the Y-axis direction of the magnetic field detection elements 1A to 1D before the stress in the Y-axis direction is applied. Accordingly, for example, the strain $\varepsilon$ of +1.0E-03 means that an object having a length of 1 (one) m has been expanded to have a length of 1001 mm by applying the stress, and, for example, the strain $\varepsilon$ of −1.0E-03 means that a length of the an object having a length of 1 (one) m has been shrunk to have a length of 999 mm by applying the stress. Further, the measurement magnetic field Hm having a positive value means that the measurement magnetic field Hm is applied to the magnetic field detection elements 1A to 1D in substantially the same direction (+X direction in the example of FIG. 1) as the directions of the magnetization J1B and the magnetization J1D, and the measurement magnetic field Hm having a negative value means that the measurement magnetic field Hm is applied to the magnetic field detection elements 1A to 1D in substantially the same direction (−X direction in the example of FIG. 1) as the directions of the magnetization J1A and the magnetization J1C.

As illustrated in FIG. 3, it can be appreciated that the output voltage [V] varies depending on the value of the strain ε occurred in the magnetic field detection elements 1A to 1D. Where a case in which no strain ε is occurred in the magnetic field detection elements 1A to 1D, that is, the strain ε is 0.0E+00 (curve C3-3), is regarded as a standard, the absolute value of the output voltage [V] drops in a case where the strain ε having a positive value is occurred (curves C3-1 and C3-2), whereas the absolute value of the output voltage [V] rises in a case where the strain ε having a negative value is occurred (curves C3-4 and C3-5). Therefore, in a case where a magnetostrictive constant of the free layer included in each of the magnetic field detection elements 1A to 1D is negative, the sensitivity of the magnetic field detection elements 1A to 1D with respect to the measurement magnetic field Hm enhances by applying the compressive stress in the Y-axis direction to the magnetic field detection elements 1A to 1D. Also, in the case where the magnetostrictive constant of the free layer included in each of the magnetic field detection elements 1A to 1D is positive, the sensitivity of the magnetic field detection elements 1A to 1D with respect to the measurement magnetic field Hm enhances by applying the stretching stress in the Y-axis direction to the magnetic field detection elements 1A to 1D.

Figure 4:
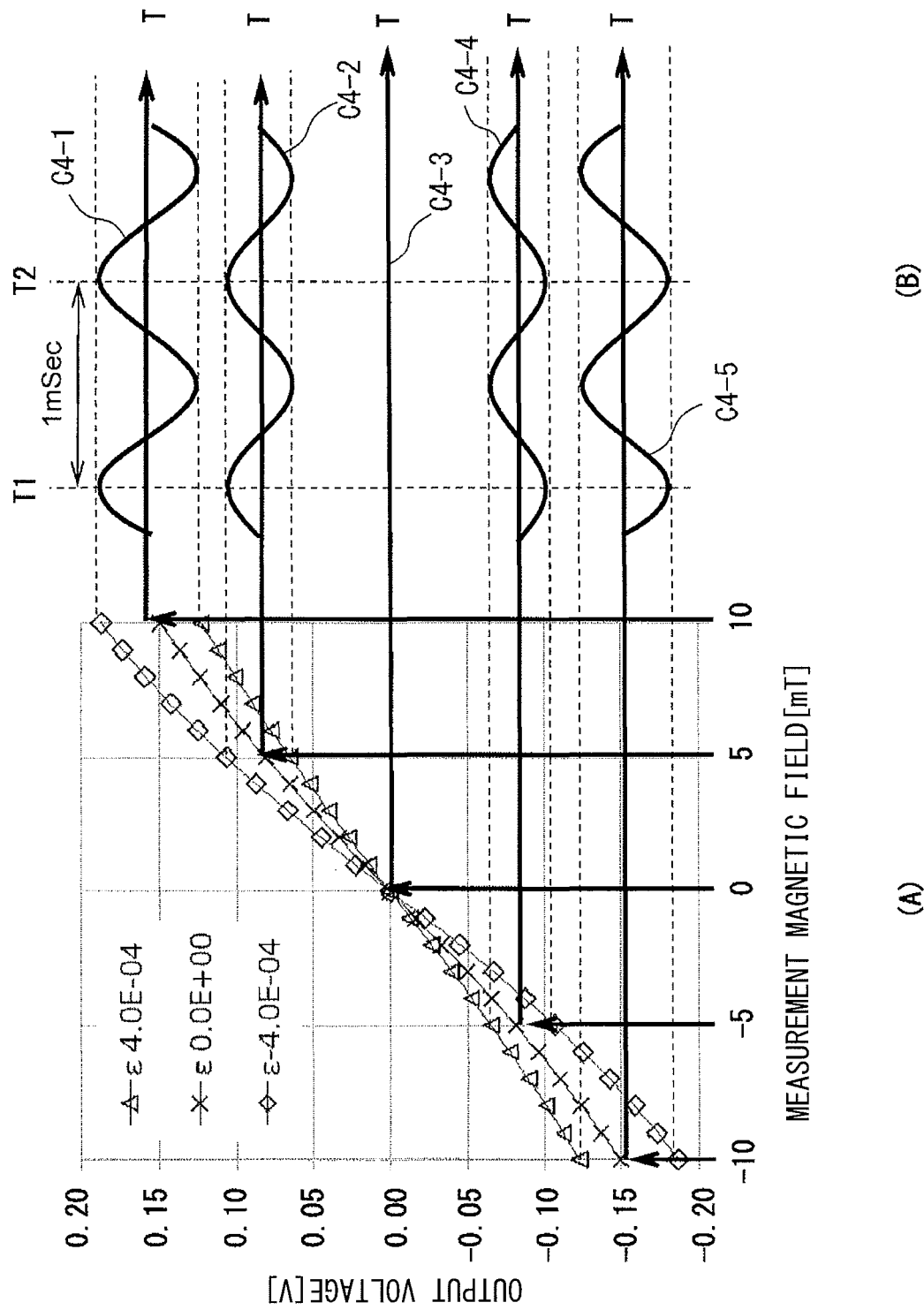
FIG. 4 is a characteristic diagram illustrating a relationship between an output from a magnetic field detection section including the magnetic field detection elements whose sensitivity has been modulated by applying a stress and a measurement magnetic field applied to the magnetic field detection elements.

As described above, the sensitivity modulation in the magnetic field detection elements 1A to 1D occurs depending on the value of the strain ε caused by a stress applied to the magnetic field detection elements 1A to 1D. Accordingly, when a stress is applied to the magnetic field detection elements 1A to 1D under an environment in which a measurement magnetic field Hm having a certain value is applied, the output voltage outputted from the magnetic field detection section 10 periodically fluctuates as illustrated in FIG. 4. FIG. 4 is a characteristic diagram illustrating a relationship of the output voltage outputted from the magnetic field detection section 10 including the magnetic field detection elements 1A to 1D whose sensitivity has been modulated by applying a stress in the Y-axis direction oscillating at the first frequency versus the measurement magnetic field Hm applied to the magnetic field detection elements 1A to 1D.

In FIG. 4, (A) illustrates an output voltage [V] of the differential signal S1. The differential signal S1 is obtained by, while applying, to the magnetic field detection elements 1A to 1D, the stress in the Y-axis direction, applying the measurement magnetic field Hm in a range from −10 mT to +10 mT in the X-axis direction. It is to be noted that the differential signal S1 is obtained by applying, by the power supply Vcc, a predetermined voltage between the node P3 and the node P4 of the bridge circuit including the four magnetic field detection elements 1A to 1D, and detecting, by the differential detector 4, a difference on the basis of a signal e1 and a signal e2 respectively extracted from the nodes P1 and P2 of the bridge circuit. In (A) of FIG. 4, the horizontal axis indicates the measurement magnetic field Hm [mT], and the vertical axis indicates the output voltage [V], and a relationship is illustrated between the measurement magnetic field Hm and the output voltage [V], with respect to each of the strains ε of three levels, +4.0E-04, 0.0E+00, and −4.0E-04.

Further, (B) of FIG. 4 illustrates a variation with time of the output voltage [V] outputted from the magnetic field detection section 10 in a case where the stress that causes an AC strain ε whose maximum amplitude is ±4.0E-04 to occur is applied in a state in which each of the measurement magnetic fields Hm of five levels, +10 mT, +5 mT, 0 (zero) mT, −5 mT, and −10 mT is applied. In (B) of FIG. 4, the horizontal axis indicates a time T, and the vertical axis indicates the output voltage [V] of the differential signal S1. Further, (B) of FIG. 4 illustrates an example of a case where the stress is applied to cause an AC strain ε of 1 (one) kHz to occur, that is, a case where one cycle from a time T1 to a time T2 is 1 (one) msec. Moreover, in (B) of FIG. 4, a curve C4-1 represents a characteristic in a case where the measurement magnetic field Hm of +10 mT is applied to the magnetic field detection elements 1A to 1D, a curve C4-2 represents a characteristic in a case where the measurement magnetic field Hm of +5 mT is applied to the magnetic field detection elements 1A to 1D, a curve C4-3 represents a characteristic in a case where the measurement magnetic field Hm of 0 (zero) mT is applied to the magnetic field detection elements 1A to 1D, a curve C4-4 represents a characteristic in a case where the measurement magnetic field Hm of −5 mT is applied to the magnetic field detection elements 1A to 1D, and a curve C4-5 represents a characteristic in a case where the measurement magnetic field Hm of −10 mT is applied to the magnetic field detection elements 1A to 1D.

As illustrated in FIG. 4, it can be appreciated that in the case where the stress that causes the AC strain ε to occur is applied under an environment in which a predetermined measurement magnetic field Hm is applied, the output voltage [V] outputted from the magnetic field detection section 10 periodically fluctuates. In this case, with an increase in the absolute value of the measurement magnetic field Hm, the magnitude of fluctuation also increases. In addition, it can be appreciated that with the change of the application direction of the measurement magnetic field Hm into the opposite direction, the phase of the output voltage [V] is also inverted.

Figure 5A:
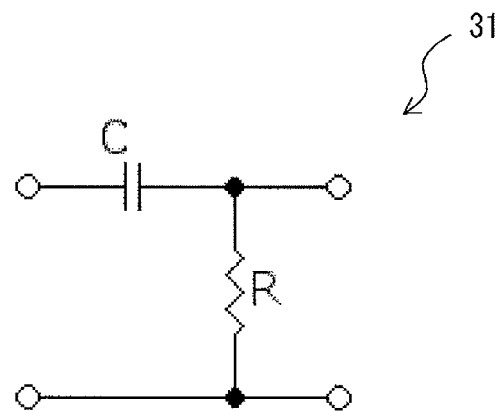
FIG. 5A is a circuit diagram illustrating a circuit configuration example of a high-pass filter illustrated in FIG. 2.
Figure 5B:
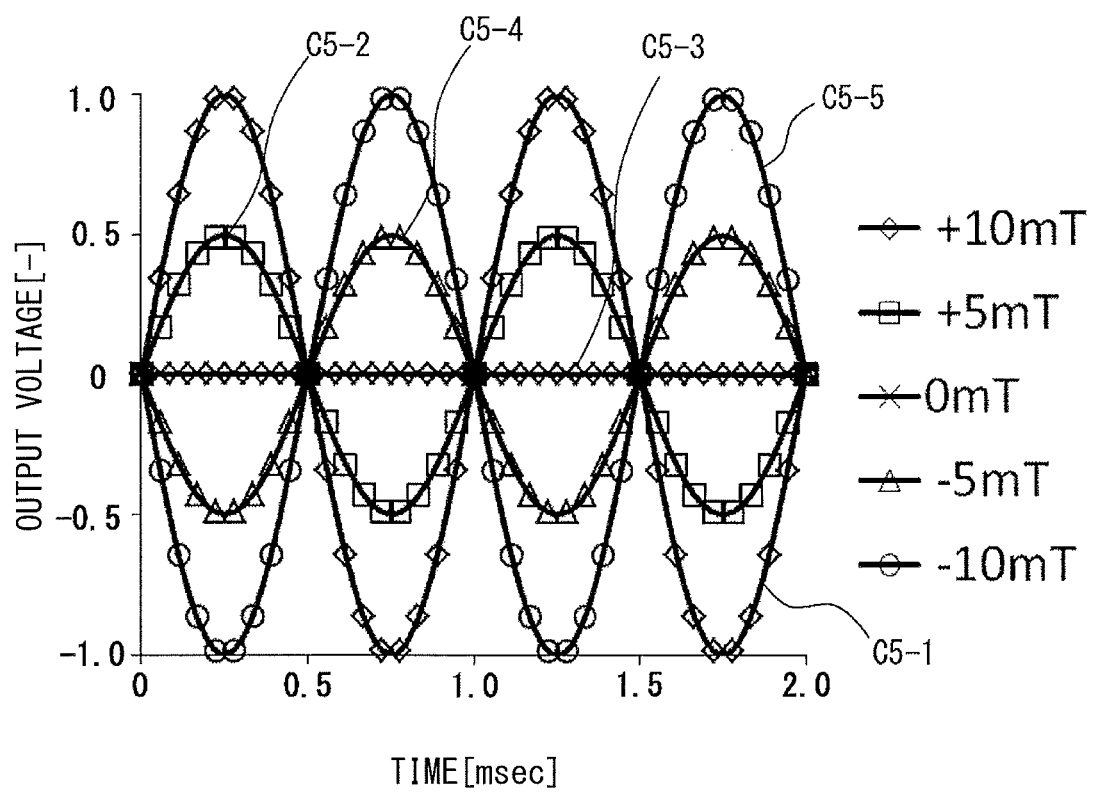
FIG. 5B is a characteristic diagram illustrating an example of waveforms of an output signal outputted from the magnetic field detection elements, after passing the high-pass filter illustrated in FIG. 5A.

In the magnetic field detection device 100, the magnetic field detection section 10 may generate the differential signal S1, and thereafter, the high-pass filter 31 may cut a frequency component having a frequency lower than the second frequency (500 Hz, for example) included in the differential signal S1 outputted from the magnetic field detection section 10. This may cause a 1/f noise, which is a frequency component having a frequency lower than the second frequency (500 Hz, for example) to be removed. It is to be noted that the high-pass filter 31 may have a circuit configuration illustrated in FIG. 5A, for example. Further, FIG. 5B is a characteristic diagram illustrating an example of waveforms of the output signal S2, after passing the high-pass filter 31. The waveforms illustrated in FIG. 5B are obtained by overlapping the curves C4-1 to C4-5 illustrated in (B) of FIG. 4 on top of each other. In more detail, curves C5-1 to C5-5 illustrated in FIG. 5B respectively correspond to the curves C4-1 to C4-5 illustrated in (B) of FIG. 4. It is to be noted that in FIG. 5B, the horizontal axis indicates an elapsed time [msec], and the vertical axis indicates an output voltage [−]. The output voltage [−] in the vertical axis is represented by a numerical value standardized with a maximum value set as 1 (one).

Figure 6A:
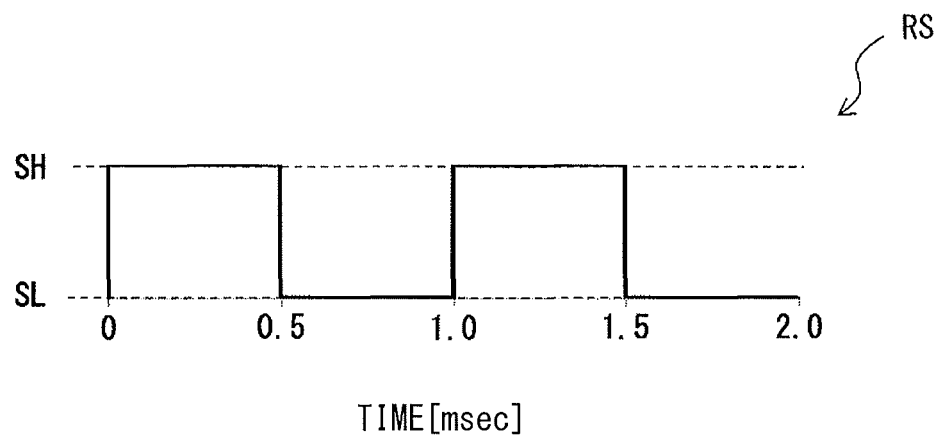
FIG. 6A is a waveform diagram illustrating an example of a reference signal to be inputted to a phase detection circuit illustrated in FIG. 2.
Figure 6B:
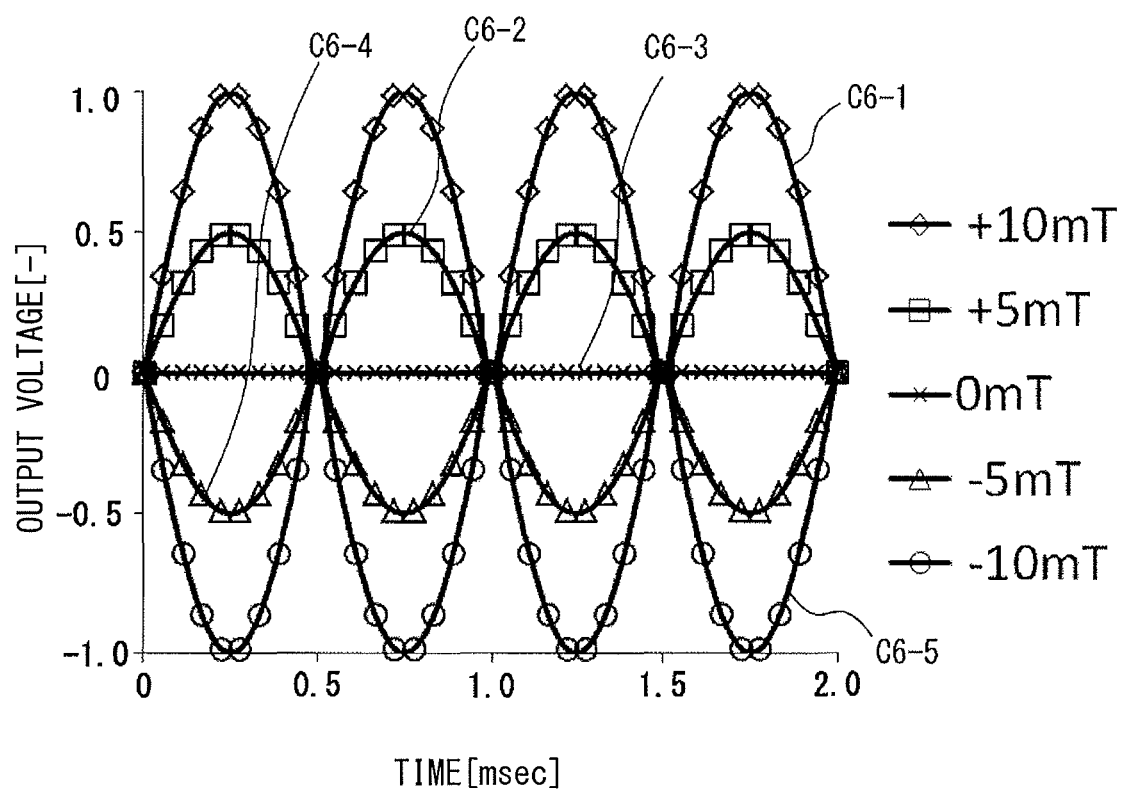
FIG. 6B is a characteristic diagram illustrating an example of waveforms of an output signal outputted from the magnetic field detection elements, after passing the phase detection circuit illustrated in FIG. 2.

In the magnetic field detection device 100, the high-pass filter 31 may generate the output signal S2, and thereafter, the phase detection circuit 32 may, for example, refer to the reference signal RS illustrated in FIG. 6A and demodulate the output signal S2, and may output the phase detection signal S3. FIG. 6A is a waveform diagram illustrating an example of the reference signal RS to be inputted to the phase detection circuit 32. The reference signal RS may be a rectangular wave signal that is synchronized with a cycle of the waveform of the output signal S2 illustrated in FIG. 5B, in which a value SH and a value SL are alternately repeated every 0.5 msec, for example. In the first example embodiment, when the reference signal RS has the value SH, the phase detection circuit 32 may pass the output signal S2 without inverting the sign of the output voltage, and, when the reference signal RS has the value SL, the phase detection circuit 32 may invert the sign of the output voltage and pass the output signal S2, for example. As a result, the phase detection signal S3 having waveforms illustrated in FIG. 6B, for example, may be obtained. FIG. 6B is a characteristic diagram illustrating an example of waveforms of the phase detection signal S3, after passing the phase detection circuit 32. Curves C6-1 to C6-5 illustrated in FIG. 6B respectively correspond to the curves C5-1 to C5-5 illustrated in FIG. 5B.

Figure 7:
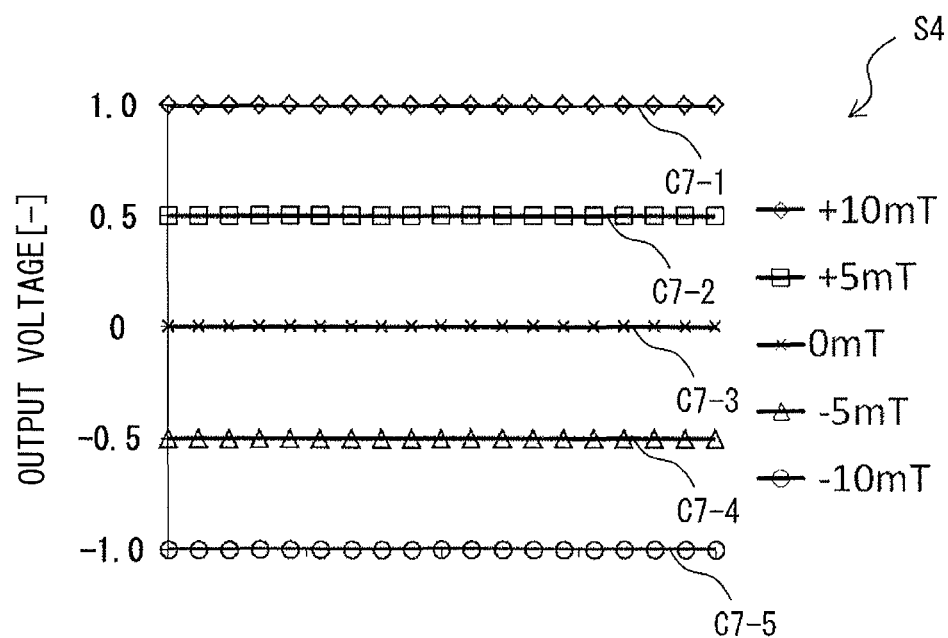
FIG. 7 is a characteristic diagram illustrating an example of waveforms of an output signal outputted from the magnetic field detection elements, after passing a low-pass filter illustrated in FIG. 2.

Thereafter, in the magnetic field detection device 100, the low-pass filter 33 may extract the measurement component from the phase detection signal S3. As a result, the output signal S4 having waveforms illustrated in FIG. 7 may be obtained, for example. Curves C7-1 to C7-5 illustrated in FIG. 7 respectively correspond to the curves C6-1 to C6-5 illustrated in FIG. 6B.

Figure 8:
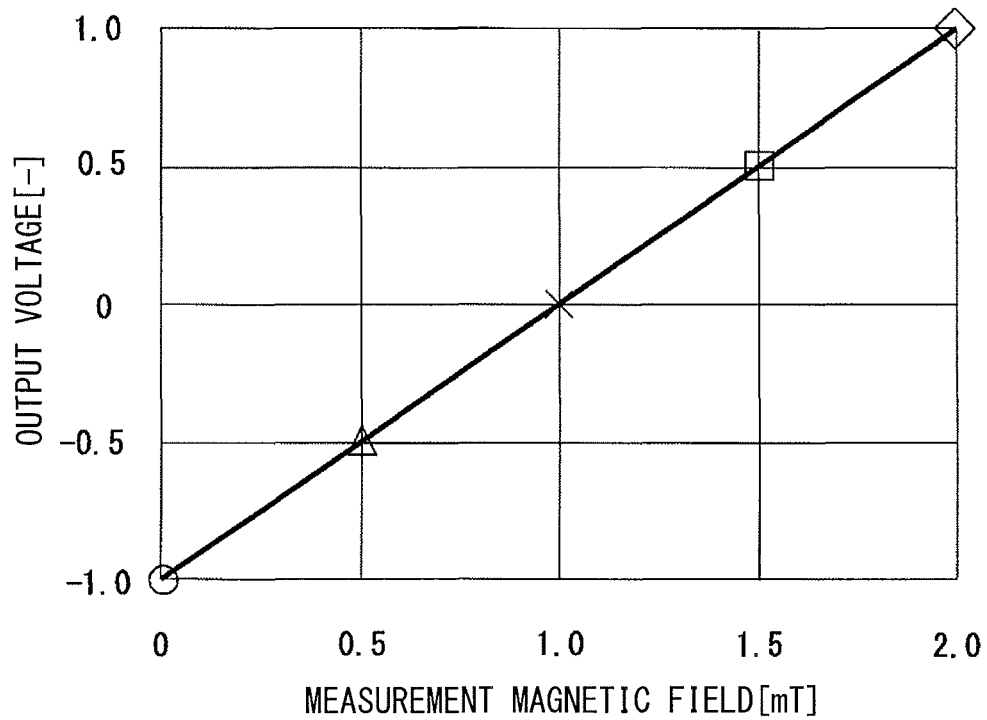
FIG. 8 is a characteristic diagram illustrating an example of a waveform of an output signal outputted from the magnetic field detection elements, after passing an analog-to-digital conversion circuit illustrated in FIG. 2.

Thereafter, in the magnetic field detection device 100, the A/D conversion circuit 34 may perform an A/D conversion on the output signal S4 serving as the measurement component which has passed the low-pass filter 33 and has been smoothed, and may output the output signal Sout to an outside. FIG. 8 illustrates an example of a waveform of the output signal Sout, after passing the A/D conversion circuit 34. In FIG. 8, the horizontal axis indicates the measurement magnetic field [mT], and the vertical axis indicates the output voltage [-]. As illustrated in FIG. 8, in the output signal Sout, the measurement magnetic field [mT] applied to the magnetic field detection elements 1A to 1D is substantially proportional to the output voltage [-].

Example Effects of Magnetic Field Detection Device 100

In the magnetic field detection device 100 according to the first example embodiment, the sensitivity of the magnetic field detection elements 1A to 1D is modulated by applying, by the stress application section 21, the stretching stress SS and the compressive stress CS in the Y-axis direction to the magnetic field detection elements 1A to 1D, as described above. With the sensitivity modulation, the amplitude of the output voltage V outputted from the magnetic field detection elements 1A to 1D varies depending on the intensity of the measurement magnetic field Hm, and thus, it is possible to detect the intensity of the measurement magnetic field Hm by the demodulator 30 on the basis of the amplitude of the output voltage V. For example, a built-in magnetic compass contained in a mobile phone often measures an intensity of a measurement magnetic field having a frequency of approximately 0 (zero) to 100 Hz. An existing magnetic compass has not been able to obtain a sufficient detection resolution due to an influence of a large 1/f noise that has occurred in a magneto-resistive effect element within the above frequency band. In contrast, according to the magnetic field detection device 100 of the first example embodiment and the method of detecting a magnetic field of the first example embodiment, the 1/f noise is effectively removed and a higher detection resolution is achieved. Accordingly, with the first example embodiment, a high reproducibility is obtained in measuring a magnetic field.

Figure 9:
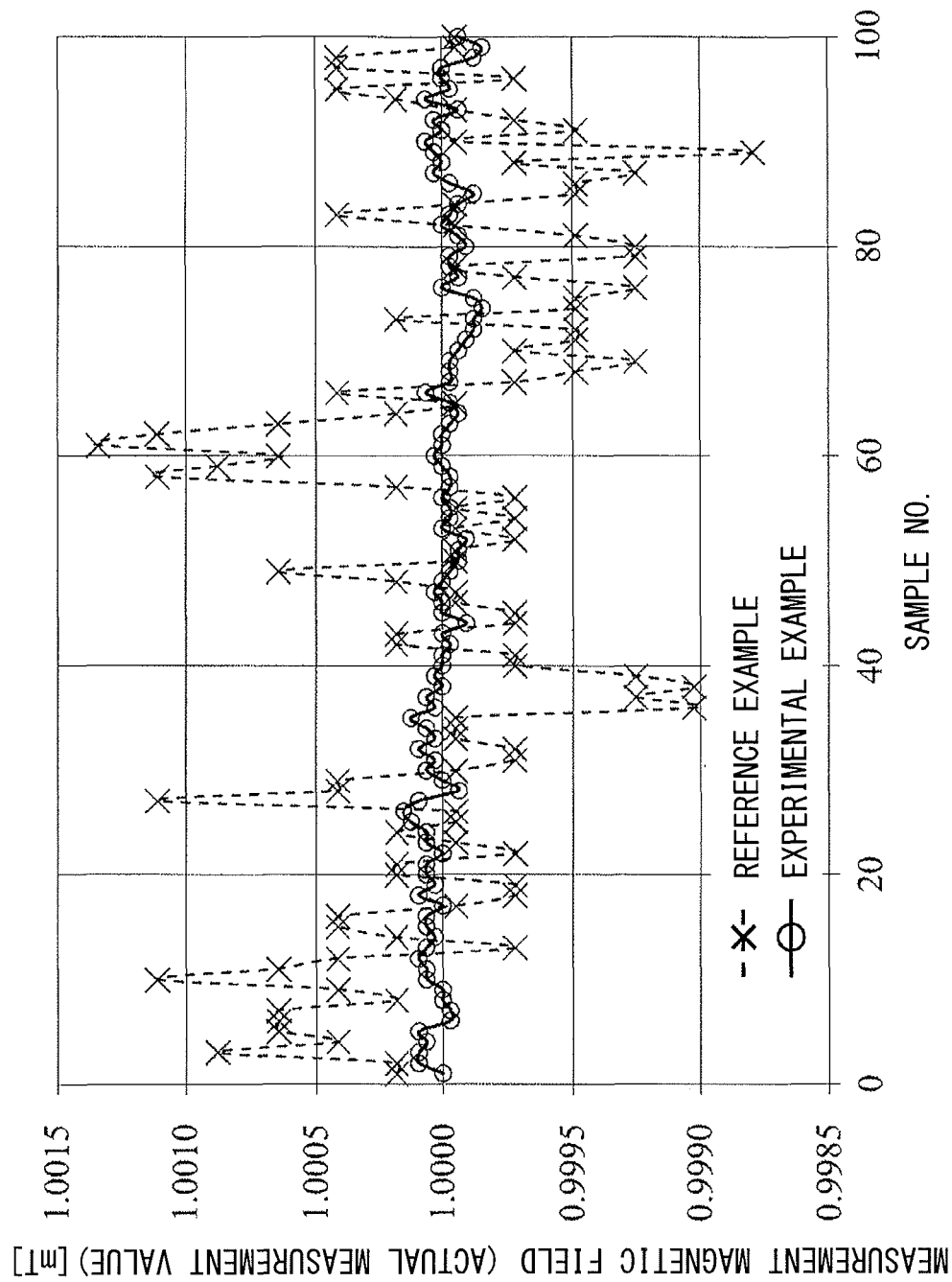
FIG. 9 is a characteristic diagram comparing measurement values of measurement magnetic fields measured by the magnetic field detection device illustrated in FIG. 1 with measurement values of measurement magnetic fields measured by a magnetic field detection device of a reference example.

FIG. 9 is an experimental example representing dispersion of measurement values of the measurement magnetic fields Hm in the X-axis direction measured by the magnetic field detection device 100 according to the first example embodiment. In FIG. 9, the horizontal axis indicates a sample number, and the vertical axis indicates an actual measured value of a measurement magnetic field. For comparison, FIG. 9 also includes actual measured values of measurement magnetic fields Hm according to a reference example. The reference example uses a magnetic field detection device having substantially the same configuration as the magnetic field detection device 100 according to the first example embodiment, except that no modulator 20 is included and no stress is applied to the magnetic field detection element. As illustrated in FIG. 9, it can be appreciated that the experimental example has smaller dispersion of the actual measurement values of the measurement magnetic fields Hm and achieves a higher detection resolution as compared with the reference example.

In addition, the sensitivity of the magnetic field detection elements 1A to 1D is enhanced owing to the modulator 20 in the first example embodiment. Hence, it is possible to detect even a weaker measurement magnetic field Hm with high accuracy. Moreover, the sensitivity of the magnetic field detection elements 1A to 1D is modulated by applying the stress using the electrostatic force, without using a magnetic material that can serve as a generation source of the 1/f noise. Hence, it is possible to avoid an obstruction of an operation of detecting the measurement magnetic field Hm in the magnetic field detection elements 1A to 1D. For example, the MEMS device of U.S. Pat. No. 7,915,891 described above includes flux concentrators 40 that includes a magnetic material. Therefore, it is highly possible that the flux concentrators 40 serve as a noise generation source.

Moreover, in the output signal S2 that has passed the high-pass filter 31, only the frequency component demodulated in the phase detection circuit 32 on the basis of the reference signal RS is outputted finally as the output signal Sout. Hence, it is possible to achieve a higher signal-to-noise (S/N) ratio in the first example embodiment.

2. SECOND EXAMPLE EMBODIMENT

Configuration of Demodulator 30A

Figure 10:
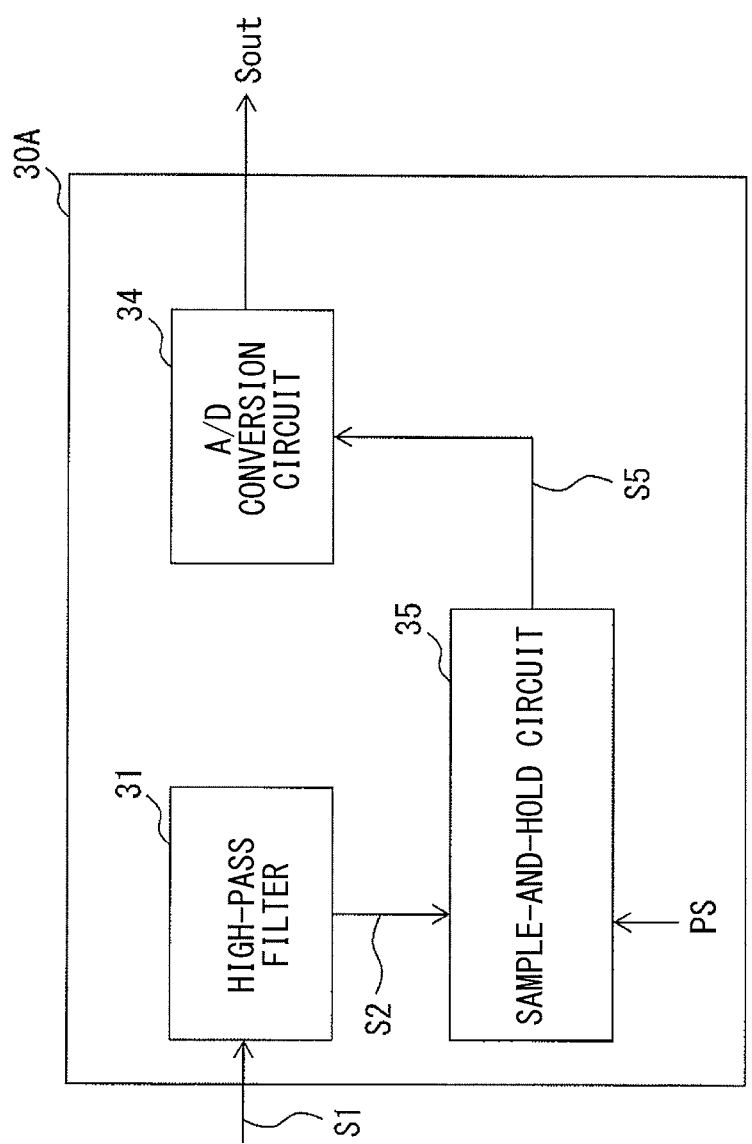
FIG. 10 is a block diagram illustrating a configuration example of a demodulator included in a magnetic field detection device according to one example embodiment of the disclosure.

FIG. 10 is a block diagram illustrating a configuration example of a demodulator 30A according to a second example embodiment of the disclosure. As with the demodulator 30 of the first example embodiment, the demodulator 30A may be mountable to the magnetic field detection device 100, and is able to contribute to enhancement in an S/N ratio by demodulating the differential signal S1 whose sensitivity has been modulated in the modulator 20.

As illustrated in FIG. 10, the demodulator 30A may include a sample-and-hold circuit 35 instead of the phase detection circuit 32 included in the demodulator 30. Further, the demodulator 30A may include no low-pass filter 3. Apart from the above, the demodulator 30A may have substantially the same configuration as the demodulator 30.

Figure 11A:
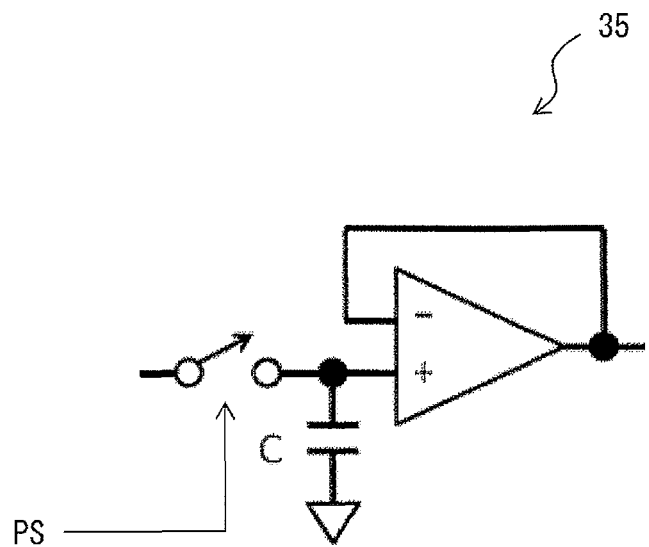
FIG. 11A is an explanatory diagram illustrating a configuration example of a sample-and-hold circuit illustrated in FIG. 10 and an example of a sample pulse signal to be inputted to the sample-and-hold circuit.
Figure 11B:
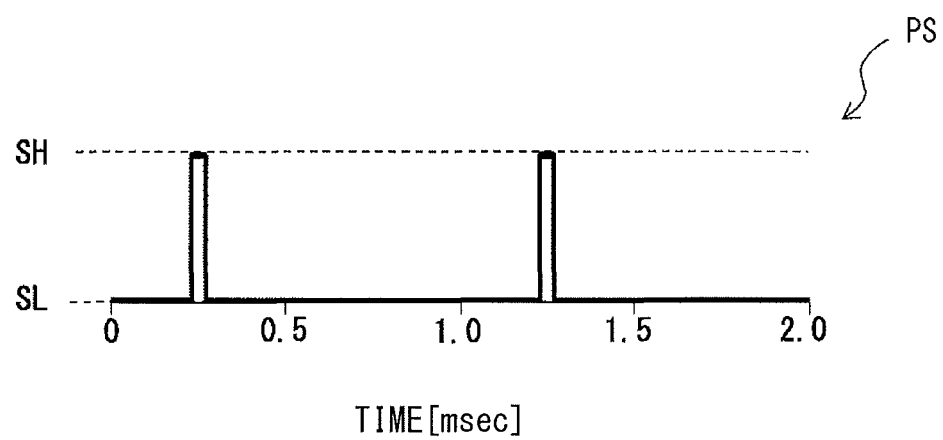
FIG. 11B is a characteristic diagram illustrating an example of a waveform of the sample pulse signal to be inputted to the sample-and-hold circuit illustrated in FIG. 10.

FIG. 11A illustrates a configuration example of the sample-and-hold circuit 35. Further, the FIG. 11B illustrates a characteristic diagram of an example of a waveform of a sample pulse signal PS to be inputted to the sample-and-hold circuit 35. The sample-and-hold circuit 35 may refer to the sample pulse signal PS inputted from an outside of the sample-and-hold circuit 35, and may perform sampling on the peak values of the waveforms of the output signal S2 illustrated in FIG. 5B. By the sampling, the sample-and-hold circuit 35 may demodulate the output signal S2, and may output an output signal S5. The waveforms of the output signal S5 may be substantially the same as the waveforms of the output signal S4 illustrated in FIG. 7, for example.

In the demodulator 30A, the A/D conversion circuit 34 may perform an A/D conversion on the output signal S5 which has passed the sample-and-hold circuit 35, and may output the output signal Sout to an outside. In one embodiment of the disclosure, the output signal S5 corresponds to a specific but non-limiting example of a "sample component". At that time, the A/D conversion circuit 34 may perform the A/D conversion including a time-averaging process on a plurality of sample components. One reason is that this further suppresses dispersion of measurement values of the measurement magnetic field Hm.

Workings and Example Effects of Demodulator 30A

Also in the second example embodiment, the demodulator 30A demodulates the differential signal S1 whose sensitivity has been modulated in the modulator 20, and is thus able to contribute to enhancement in the S/N ratio, as with the demodulator 30 according to the first example embodiment.

3. MODIFICATION EXAMPLES

Heretofore, the disclosure has been described with reference to some example embodiments. However, the disclosure is not limited to such example embodiments, and may be modified in a variety of ways. For example, according to the foregoing example embodiments, the phase detection circuit and the sample-and-hold circuit are given as examples of the demodulator, but the disclosure is not limited thereto. Further, although the demodulator includes the high-pass filter and the low-pass filter in the foregoing example embodiments, one or both of them may be omitted in some example embodiments of the disclosure.

In the foregoing example embodiments, the stress is applied to the magnetic field detection element by deforming the deformation section 23 using the electrostatic force generated between the two opposing electrodes. However, the disclosure is not limited thereto.

Figure 12A:
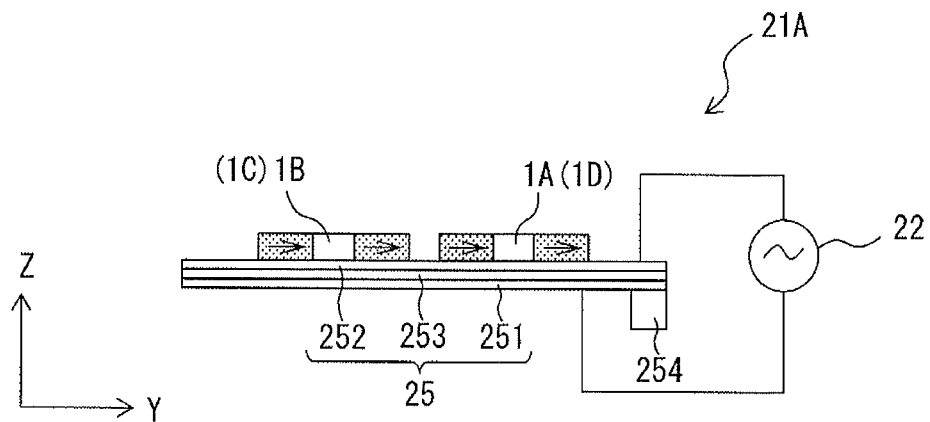
FIG. 12A is a schematic diagram illustrating a stress application section according to a first modification example of one example embodiment of the disclosure.

In one example, as in the case of a stress application section 21A according to a first modification example illustrated in FIG. 12A, for example, a deformation section 25 may be provided instead of the deformation section 23 and the fixing section 24. The deformation section 25 may include a first electrode 251, a second electrode 252, and a piezoelectric substrate 253. The piezoelectric substrate 253 may be provided between the first electrode 251 and the second electrode 252. The piezoelectric substrate 253 may exhibit an elasticity, and may include a piezoelectric material such as lead zirconate titanate (PZT). The piezoelectric substrate 253 may be supported by a support 254 at one end in the Y-axis direction. The magnetic field detection elements 1A to 1D may be provided on the deformation section 25, and may be electrically insulated from the first electrode 251 and from the second electrode 252. In FIG. 12A, and also in FIG. 12B and FIG. 12C to be described later, examples in which the magnetic field detection elements 1A to 1D are provided on a surface of the second electrode 252 that is provided on the piezoelectric substrate 253. The piezoelectric substrate 253 may be configured to be deformed owing to an inverse piezoelectric effect, by an AC voltage being applied by the AC power supply 22 to the first electrode 251 and the second electrode 252. That is, with the AC voltage being applied by the AC power supply 22, the stress application section 21A may be configured to apply, to the magnetic field detection elements 1A to 1D, a stress oscillating at a first frequency and including a component in the Y-axis direction that is orthogonal to the X-axis direction. The stress applied to each of the magnetic field detection elements 1A to 1D may cause a sensitivity modulation in the magnetic field detection elements 1A to 1D. In one embodiment of the disclosure, the piezoelectric substrate 253 corresponds to a specific but non-limiting example of a "piezoelectric member".

Figure 12B:
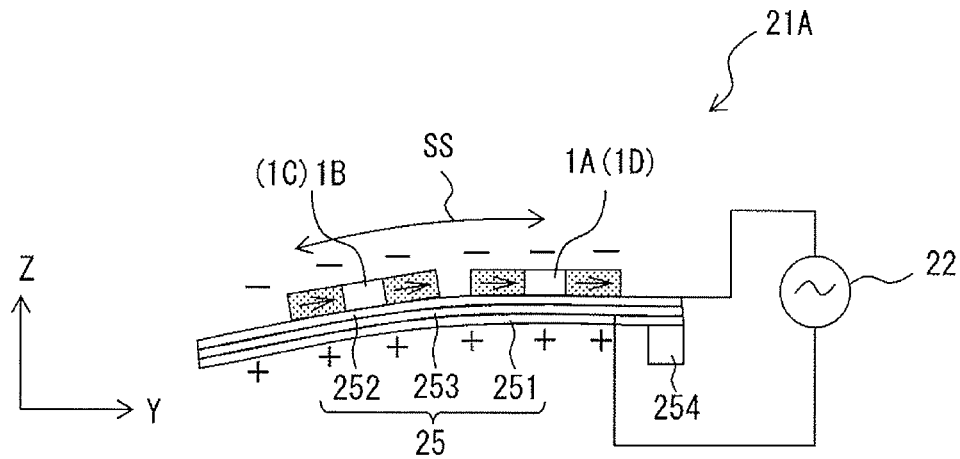
FIG. 12B is a first explanatory diagram illustrating an operation of the stress application section illustrated in FIG. 12A.
Figure 12C:
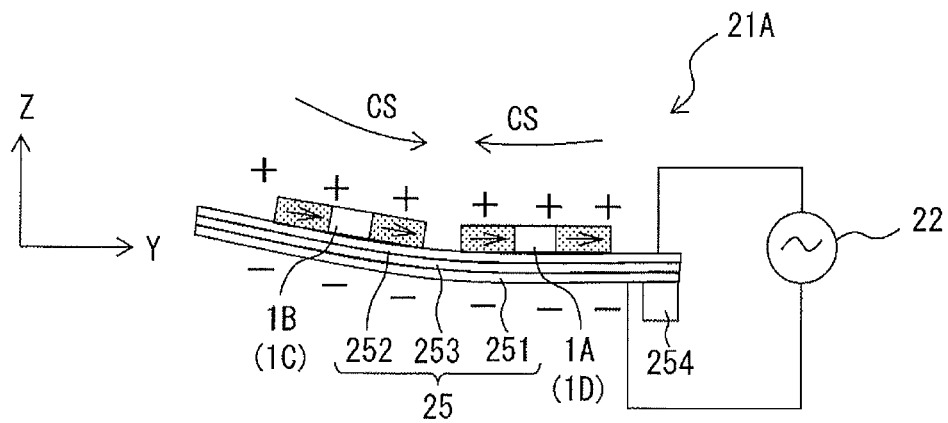
FIG. 12C is a second explanatory diagram illustrating an operation of the stress application section illustrated in FIG. 12B.

Next, description is given, with reference to FIG. 12B and FIG. 12C, of operations of the stress application section 21A.

FIG. 12B illustrates a state in which the deformation section 25 is deformed such that the deformation section 25 is curved to a side of the first electrode 251 in the Z-axis direction. In a case where the deformation section 25 is to be deformed, the AC power supply 22 may apply the AC voltage to the stress application section 21A to cause a sign of an electric potential of the first electrode 251 to be opposite to a sign of an electric potential of the second electrode 252. In one example, in a case where the deformation section 25 is to be deformed as illustrated in FIG. 12B, the first electrode 251 may be caused to have a positive electric potential, and the second electrode 252 may be caused to have a negative electric potential. One end in the Y-axis direction of the piezoelectric substrate 253 may be fixed by the support 254. Therefore, the other end at the opposite side of the support 254 in the Y-axis direction may be bent most. When the deformation section 25 is deformed as in FIG. 12B, a stretching stress SS in the Y-axis direction may be applied to the magnetic field detection elements 1A to 1D provided on the deformation section 25. Here, in a case where a magnetostrictive constant of a free layer included in each of the magnetic field detection elements 1A to 1D is positive, each free layer may exhibit an elasticity magnetic anisotropy in a direction that increases the bias magnetic field in the Y-axis direction. That is, the sensitivity of the magnetic field detection elements 1A to 1D may decrease. In an opposite way, in a case where the magnetostrictive constant of the free layer included in each of the magnetic field detection elements 1A to 1D is negative, each free layer may exhibit the elasticity magnetic anisotropy in a direction that decreases the bias magnetic field in the Y-axis direction. That is, the sensitivity of the magnetic field detection elements 1A to 1D may increase.

By contrast, FIG. 12C illustrates a state in which deformation section 25 is deformed such that the deformation section 25 is curved to a side of the second electrode 252 in the Z-axis direction. In a case where the deformation section 25 is to be deformed as illustrated in FIG. 12C, the first electrode 251 may be caused to have a negative electric potential, and the second electrode 252 may be caused to have a positive electric potential. When the deformation section 25 is deformed as in FIG. 12C, a compressive stress CS in the Y-axis direction may be applied to the magnetic field detection elements 1A to 1D provided on the deformation section 25. Here, in a case where a magnetostrictive constant of a free layer included in each of the magnetic field detection elements 1A to 1D is positive, each free layer may exhibit an elasticity magnetic anisotropy in a direction that decreases the bias magnetic field in the Y-axis direction. That is, the sensitivity of the magnetic field detection elements 1A to 1D may increase. In an opposite way, in a case where the magnetostrictive constant of the free layer included in each of the magnetic field detection elements 1A to 1D is negative, each free layer may exhibit the elasticity magnetic anisotropy in a direction that increases the bias magnetic field in the Y-axis direction. That is, the sensitivity of the magnetic field detection elements 1A to 1D may decrease.

In this way, the modulator 20 including the stress application section 21A according to the first modification is also able to apply the stretching stress SS and the compressive stress CS in the Y-axis direction to the magnetic field detection elements 1A to 1D, and to cause the sensitivity of the magnetic field detection elements 1A to 1D to be modulated. Therefore, effects similar to those of the example embodiments are expected to be achieved.

Figure 13:
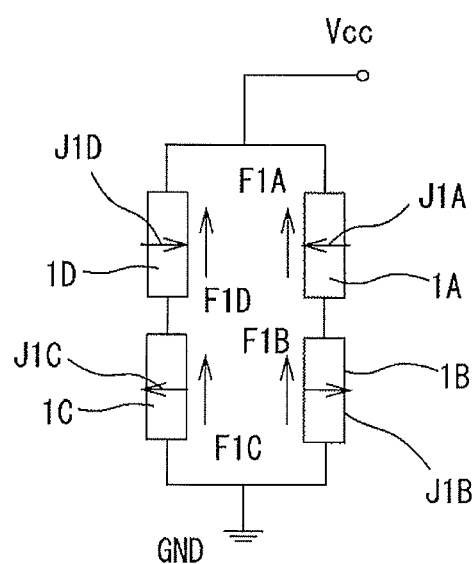
FIG. 13 is a schematic diagram illustrating magnetic field detection elements according to a second modification example of one example embodiment of the disclosure.

Moreover, although the permanent magnets are used as the bias magnetic field-applying sections in the foregoing example embodiments, the disclosure is not limited thereto. For example, an induction coil may be used as the bias magnetic field-applying section, and a bias magnetic field may be applied to the magnetic field detection element by electromagnetic induction. Still further, in some example embodiments of the disclosure, the bias magnetic field-applying section may not necessarily be provided. In such a case, as illustrated in FIG. 13, for example, a shape anisotropy of the magnetic field detection elements 1A to 1D may be used. In one example, in a state in which no external magnetic field is applied, directions of magnetizations F1A to F1D of free layers may each be stabilized in a state of being set to a longitudinal direction (Y-axis direction) of the magnetic field detection elements 1A to 1D so as to be orthogonal to directions (X-axis direction) of magnetizations J1A to J1D of pinned layers.

Moreover, the disclosure encompasses any possible combination of some or all of the various embodiments and the modification examples described herein and incorporated herein.

It is possible to achieve at least the following configurations from the above-described example embodiments of the disclosure.

(1) A magnetic field detection device including:
a magnetic field detection element having a sensitivity axis in a first direction;
a modulator configured to apply, to the magnetic field detection element, a stress oscillating at a first frequency and including a component in a second direction, the second direction being orthogonal to the first direction; and
a demodulator configured to demodulate an output signal having the first frequency and outputted from the magnetic field detection element, and detect, on a basis of an amplitude of the output signal, an intensity of a measurement magnetic field to be received by the magnetic field detection element.

(2) The magnetic field detection device according to (1), in which the modulator includes
a deformation section including a first base and a first electrode, the first base exhibiting an elasticity, the first electrode being provided on the first base, and
a fixing section including a second base and a second electrode, the second base exhibiting a rigidity higher than a rigidity of the first base, the second electrode being provided on the second base and being separated away from and facing the first electrode,
the magnetic field detection element is provided on the deformation section and is electrically insulated from the first electrode, and
an electrostatic force is configured to be generated between the deformation section and the fixing section by an alternating current voltage being applied to the first electrode and the second electrode.

(3) The magnetic field detection device according to (1), in which
the modulator includes a first electrode, a second electrode, and a piezoelectric member, the piezoelectric member being provided between the first electrode and the second electrode,
the magnetic field detection element is provided on the modulator and is electrically insulated from the first electrode and from the second electrode, and
the piezoelectric member is configured to be deformed by an alternating current voltage being applied to the first electrode and the second electrode.

(4) The magnetic field detection device according to any one of (1) to (3), in which the demodulator includes a high-pass filter configured to pass a frequency component that is at a frequency higher than or equal to a second frequency, the second frequency being lower than the first frequency.

(5) The magnetic field detection device according to (4), in which the demodulator further includes a phase detection circuit that refers to a square wave and thereby outputs a phase detection signal, the square wave having the first frequency and having a phase that is the same as a phase of the output signal outputted from the magnetic field detection element.

(6) The magnetic field detection device according to (5), in which the demodulator further includes a low-pass filter configured to smooth a measurement component of the phase detection signal and pass the smoothed measurement component of the phase detection signal.

(7) The magnetic field detection device according to (6), in which the demodulator further includes an analog-to-digital converter configured to perform an analog-to-digital conversion on the measurement component that has passed the low-pass filter.

(8) The magnetic field detection device according to (4), in which the demodulator further includes a sample-and-hold circuit.

(9) The magnetic field detection device according to (8), in which the demodulator further includes an analog-to-digital converter configured to perform an analog-to-digital conversion on a sample component that has passed the sample-and-hold circuit.

(10) The magnetic field detection device according to (9), in which the sample component includes a plurality of sample components, and the analog-to-digital converter is configured to perform the analog-to-digital conversion including a time-averaging process on the plurality of sample components.

(11) The magnetic field detection device according to any one of (1) to (10), further including a bias magnetic field-applying section configured to apply, to the magnetic field detection element, a bias magnetic field having the component in the second direction.

(12) A method of detecting a magnetic field, the method including:

applying, to a magnetic field detection element having a sensitivity axis in a first direction, a stress oscillating at a first frequency and including a component in a second direction, the second direction being orthogonal to the first direction; and detecting, on a basis of an amplitude of an output signal having the first frequency and outputted from the magnetic field detection element, an intensity of a measurement magnetic field to be received by the magnetic field detection element.

According to the magnetic field detection device and the method of detecting a magnetic field in one example embodiment of the disclosure, the sensitivity of the magnetic field detection element is modulated by applying a stress oscillating at the first frequency and including a component that is orthogonal to the sensitivity axis of the magnetic field detection element. In this way, the amplitude outputted from the magnetic field detection element varies depending on the intensity of the measurement magnetic field. Thus, the intensity of the measurement magnetic field to be received by the magnetic field detection element is detected by the demodulator, on the basis of the output amplitude outputted from the magnetic field detection element.

According to the magnetic field detection device and the method of detecting a magnetic field in one example embodiment of the disclosure, the 1/f noise is effectively removed, and a high reproducibility is obtained in measuring a magnetic field. Therefore, according to the magnetic field detection device and the method of detecting a magnetic field in one example embodiment of the disclosure, it is possible to achieve a higher detection resolution.

It is to be noted that the effects of embodiments of the disclosure are not limited thereto, and may be any effects described above.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. The term "disposed above/ provided above/ formed above" and its variants as used herein refer to elements disposed directly in contact with each other or indirectly by having intervening structures therebetween. The term "disposed on/ provided on/ formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A magnetic field detection device comprising:

a magnetic field detection element having a sensitivity axis in a first direction;

a modulator configured to apply, to the magnetic field detection element, a stress oscillating at a first frequency and including a component in a second direction, the second direction being orthogonal to the first direction; and a demodulator configured to demodulate an output signal having the first frequency and outputted from the magnetic field detection element, and detect, on a basis of an amplitude of the output signal, an intensity of a measurement magnetic field to be received by the magnetic field detection element, wherein:

the modulator includes a deformation section including a first base and a first electrode, the first base exhibiting an elasticity, the first electrode being on the first base, and a fixing section including a second base and a second electrode, the second base exhibiting a rigidity higher than a rigidity of the first base, the second electrode being on the second base and being separated away from and facing the first electrode;

the magnetic field detection element is on the deformation section and is electrically insulated from the first electrode; and an electrostatic force is configured to be generated between the deformation section and the fixing section by an alternating current voltage being applied to the first electrode and the second electrode.

2. A method of detecting a magnetic field using the magnetic field detection device of claim 1, the method comprising:

applying, to the magnetic field detection element having the sensitivity axis in the first direction, the stress oscillating at the first frequency and including the component in the second direction;

generating the electrostatic force between the deformation section and the fixing section of the modulator by the alternating current voltage being applied to the first electrode of the deformation section and the second electrode of the fixing section; and detecting, on the basis of the amplitude of the output signal having the first frequency and outputted from the magnetic field detection element, the intensity of the measurement magnetic field to be received by the magnetic field detection element.

3. The magnetic field detection device according to claim 1, further comprising a bias magnetic field-applying section configured to apply, to the magnetic field detection element, a bias magnetic field having the component in the second direction.

4. A method of detecting a magnetic field using the magnetic field detection device of claim 3, the method comprising:

applying, to the magnetic field detection element having the sensitivity axis in the first direction, the stress oscillating at the first frequency and including the component in the second direction;

applying to the magnetic field detection element the bias magnetic field having the component in the second direction; and detecting, on the basis of the amplitude of the output signal having the first frequency and outputted from the magnetic field detection element, the intensity of the measurement magnetic field to be received by the magnetic field detection element.

5. A magnetic field detection device comprising:
a magnetic field detection element having a sensitivity axis in a first direction;
a modulator configured to apply, to the magnetic field detection element, a stress oscillating at a first frequency and including a component in a second direction, the second direction being orthogonal to the first direction; and
a demodulator configured to demodulate an output signal having the first frequency and outputted from the magnetic field detection element, and detect, on a basis of an amplitude of the output signal, an intensity of a measurement magnetic field to be received by the magnetic field detection element; wherein
the modulator includes a first electrode, a second electrode, and a piezoelectric member, the piezoelectric member being between the first electrode and the second electrode,
the magnetic field detection element is on the modulator and is electrically insulated from the first electrode and from the second electrode, and
the piezoelectric member is configured to be deformed by an alternating current voltage being applied to the first electrode and the second electrode.

6. A method of detecting a magnetic field using the magnetic field detection device of claim 5, the method comprising:
applying, to the magnetic field detection element having the sensitivity axis in the first direction, the stress oscillating at the first frequency and including the component in the second direction;
deforming the piezoelectric member of the modulator between the first electrode and the second electrode of the modulator by the alternating current voltage being applied to the first electrode and the second electrode; and
detecting, on the basis of the amplitude of the output signal having the first frequency and outputted from the magnetic field detection element, the intensity of the measurement magnetic field to be received by the magnetic field detection element.

7. A magnetic field detection device comprising:
a magnetic field detection element having a sensitivity axis in a first direction;
a modulator configured to apply, to the magnetic field detection element, a stress oscillating at a first frequency and including a component in a second direction, the second direction being orthogonal to the first direction; and
a demodulator configured to demodulate an output signal having the first frequency and outputted from the magnetic field detection element, and detect, on a basis of an amplitude of the output signal, an intensity of a measurement magnetic field to be received by the magnetic field detection element,
wherein the demodulator includes:
a high-pass filter configured to pass a frequency component that is at a frequency higher than or equal to a second frequency, the second frequency being lower than the first frequency; and
a phase detection circuit that refers to a square wave and outputs a phase detection signal, the square wave having the first frequency and having the phase that is the same as a phase of the output signal outputted from the magnetic field detection element.

8. A method of detecting a magnetic field using the magnetic field detection device of claim 7, the method comprising:
applying, to the magnetic field detection element having the sensitivity axis in the first direction, the stress oscillating at the first frequency and including the component in the second direction;
detecting, on the basis of the amplitude of the output signal having the first frequency and outputted from the magnetic field detection element, the intensity of the measurement magnetic field to be received by the magnetic field detection element; and
outputting the phase detection signal based on the square wave having the first frequency and having the phase that is the same as the phase of the output signal.

9. The magnetic field detection device according to claim 7, wherein the demodulator further includes a low-pass filter configured to smooth a measurement component of the phase detection signal and pass the smoothed measurement component of the phase detection signal.

10. The magnetic field detection device according to claim 9, wherein the demodulator further includes an analog-to-digital converter configured to perform an analog-to-digital conversion on the measurement component that has passed the low-pass filter.

11. A magnetic field detection device comprising:
a magnetic field detection element having a sensitivity axis in a first direction;
a modulator configured to apply, to the magnetic field detection element, a stress oscillating at a first frequency and including a component in a second direction, the second direction being orthogonal to the first direction; and
a demodulator configured to demodulate an output signal having the first frequency and outputted from the magnetic field detection element, and detect, on a basis of an amplitude of the output signal, an intensity of a measurement magnetic field to be received by the magnetic field detection element,
wherein the demodulator includes:
a high-pass filter configured to pass a frequency component that is at a frequency higher than or equal to a second frequency, the second frequency being lower than the first frequency,
a sample-and-hold circuit; and
an analog-to-digital converter configured to perform an analog-to-digital conversion on a sample component that has passed the sample-and-hold circuit.

12. The magnetic field detection device according to claim 11, wherein the sample component comprises a plurality of sample components, and the analog-to-digital converter is configured to perform the analog-to-digital conversion including a time-averaging process on the plurality of sample components.

13. A method of detecting a magnetic field using the magnetic field detection device of claim 11, the method comprising:
applying, to the magnetic field detection element having the sensitivity axis in the first direction, the stress oscillating at the first frequency and including the component in the second direction;
detecting, on the basis of the amplitude of the output signal having the first frequency and outputted from the magnetic field detection element, the intensity of the measurement magnetic field to be received by the magnetic field detection element; and performing the analog-to-digital conversion on the sample component of the output signal that has passed the sample-and-hold circuit.

\* \* \* \* \*